(12) United States Patent
Lee et al.

(10) Patent No.: US 6,933,226 B2
(45) Date of Patent: Aug. 23, 2005

(54) METHOD OF FORMING A METAL GATE IN A SEMICONDUCTOR DEVICE

(75) Inventors: Sang Ick Lee, Kyoungki-do (KR); Hyung Hwan Kim, Kyoungki-do (KR); Se Aug Jang, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 09/994,284

(22) Filed: Nov. 26, 2001

(65) Prior Publication Data

US 2002/0076867 A1 Jun. 20, 2002

(30) Foreign Application Priority Data

Nov. 24, 2000 (KR) .......................................... 2000-70219

(51) Int. Cl.$^7$ ............................................ H01L 21/4763
(52) U.S. Cl. ...................... 438/633; 438/645; 438/690; 438/691; 438/692; 438/693
(58) Field of Search ................................ 438/633, 645, 438/690–693

(56) References Cited

U.S. PATENT DOCUMENTS

| | | | |
|---|---|---|---|
| 5,356,833 A | * | 10/1994 | Maniar et al. .............. 438/656 |
| 5,966,597 A | | 10/1999 | Wright |
| 5,985,726 A | | 11/1999 | Yu et al. |
| 6,008,084 A | | 12/1999 | Sung |
| 6,048,762 A | | 4/2000 | Hsia et al. |
| 6,077,733 A | | 6/2000 | Chen et al. |
| 6,194,301 B1 | | 2/2001 | Radens et al. |
| 6,225,170 B1 | | 5/2001 | Ibok et al. |

FOREIGN PATENT DOCUMENTS

| | | |
|---|---|---|
| JP | 0012538 | 1/2000 |
| JP | 0036083 | 2/2001 |

* cited by examiner

*Primary Examiner*—George Fourson
*Assistant Examiner*—Thanh V. Pham
(74) *Attorney, Agent, or Firm*—Ladas & Parry LLP

(57) ABSTRACT

A method of forming a gate in a semiconductor device includes forming a dummy gate insulating layer on a semiconductor substrate having a field oxide layer isolating the device, depositing a dummy gate polysilicon layer and a hard mask layer on the dummy gate insulating layer sequentially, patterning the hard mask layer into a mask pattern and patterning the dummy gate polysilicon layer using the mask pattern as an etch barrier, forming spacers at both sidewalls of the dummy gate polysilicon layer, depositing an insulating interlayer on the resultant structure after forming the spacers, exposing a surface of the dummy gate polysilicon layer by carrying out an oxide layer CMP process having a high selection ratio against the dummy gate polysilicon layer, forming a damascene structure by removing the dummy gate polysilicon layer and the dummy gate insulating layer using the insulating interlayer as another etch barrier, depositing a gate insulating layer and a gate metal layer on the entire surface of the semiconductor substrate having the damascene structure, and exposing a surface of the insulating interlayer by carrying out a metal CMP process having a high selection ratio against the insulating interlayer.

7 Claims, 6 Drawing Sheets

METHOD OF FORMING A METAL GATE IN A SEMICONDUCTOR DEVICE

BACKGROUND OF THE INVENTION

1. Field of the Invention

The present invention relates generally to a method of forming a gate in a semiconductor device, and more particularly, to a method of forming a metal gate in a semiconductor device using a damascene process.

2. Description of the Related Art

Semiconductor variables such, as gate width, gate insulating layer thickness, junction depth and the like are progressively being reduced as the integration of a semiconductor is increased. Fabrication methods of polysilicon gates fail to further realize the low resistance required for critical dimensions. In the mean time, developments for a gate having new gate material as a substitute for polysilicon and having new structure are necessitated. In the past, research and development efforts were focused on a polysilicide gate using transition metal-silicide materials.

Yet, the polysilicide gate still contains a polysilicon as a constituent, which results in increasing the difficulty in realizing low resistance. The polysilicon constituent in the polysilicide gate brings about increasingly effective thicknesses of a gate insulating layer due to a gate depletion effect, as well as threshold voltage variance due to boron penetration/dopant distribution fluctuation in a p+ doped polysilicon gate and the like, thereby limiting the ability to realize low resistance therein.

Boron penetration and gate depletion do not arise in a metal gate using no dopant. Moreover, metal gates use a metal having a work function value corresponding to a mid-band gap of silicon applied to a single gate, thereby enabling the formation of a symmetric threshold voltage in NMOS and PMOS areas. In this case, W, WN, Ti, TiN, Mo, Ta, TaN and the like comprise metals of which work function values correspond to the mid-gap of silicon.

If a semiconductor device is fabricated using a metal gate, difficulty arises in patterning a metal gate, i.e., difficulty of etching, plasma damages in the etching and ion implantation processes and thermal damage caused by a thermal process after the gate formation are generated, thereby reducing the device characteristics.

Accordingly, in order to overcome these perceived disadvantages, a method of forming a metal gate is proposed that includes the steps of forming a sacrificing gate of polysilicon, forming an insulating layer, removing the sacrificing gate, depositing a metal layer, and polishing the metal layer. The sacrificing gate is replaced by a metal gate, so that a gate is formed without using an etching process. Therefore, the damascene process avoids the problems caused by etching processes, and also enables use of the conventional semiconductor fabrication processes.

FIGS. 1A to 1G illustrate cross-sectional views of the steps of fabricating a MOSFET device having a tungsten gate using a conventional damascene process.

Referring to FIG. 1A, a field oxide layer, (not shown) defining a device active area, is formed on a surface of a semiconductor substrate land a dummy gate silicon oxide layer 2 is formed on the semiconductor substrate 1. A dummy gate polysilicon layer 3 and a hard mask layer 4 are then successively formed on the dummy gate silicon oxide layer 2.

Referring to FIG. 1B, a mask pattern 4a is formed by patterning the hard mask layer 4. A dummy gate 5 is then formed by etching the dummy gate polysilicon layer 3 and silicon oxide layer 2 using the mask pattern 4a.

Referring to FIG. 1C, LDD (lightly doped drain) regions are formed in portions of the silicon substrate 1 below both lateral sides of the dummy gate 5 by ion implantation at a relatively low dose and energy. Then, spacers 6 are formed at both sidewalls of the dummy gate 5 by using known processes. Subsequently, source region s and drain region d are formed at the portions of the semiconductor substrate 1 below both lateral sides of the dummy gate 5 by heavy ion implantation.

Referring to FIG. 1D, an insulating interlayer 7 is deposited on the semiconductor substrate 1. The dummy gate polysilicon layer 3 of the dummy gate 5 is exposed by planarizing a surface of the insulating interlayer 7 by using chemical mechanical polishing (hereinafter abbreviated CMP) on the insulating interlayer 7.

Referring to FIG. 1D, the dummy gate, exposed by CMP, is removed. Now referring to FIG. 1E, a gate insulating layer 8 is then formed along a surface of the resultant structure. Subsequently, a gate metal layer 9, such as a tungsten layer, is deposited on the gate insulating layer 8.

Referring to FIG. 1F, a metal gate is formed by polishing the gate metal layer 9 and the gate insulating layer 8 until the insulating interlayer 7 is exposed. Thus, a MOSFET device having the metal gate is completed, as shown.

Unfortunately, the gate formed by using the conventional damascene process has disadvantages, as described below.

In a semiconductor fabrication process, a device isolation process has to precede the gate electrode formation and a gate electrode line traverses active and field areas simultaneously. As shown in FIG. 2, the surface of a field oxide layer 11 is generally higher than the surface of the semiconductor substrate 1 in the active area t in the device isolation process. Thus, a step difference a shown in FIG. 2 as the gap between the top portion of the field oxide layer 11 defining the field area h (FIG. 2) and the top portion of the semiconductor substrate, a mid-portion of which is defined as the active area t is generally between 200 to 500 Å.

A general CMP process completely planarizes an entire surface regardless of the field and active areas h and t along a dotted line AA'. This causes a problem in forming a poly wordline having an irregular thickness if the polishing process is carried out until the dummy gate polysilicon layer 3 is exposed, as shown in FIG. 1D. Yet, a surface of the polysilicon layer 3 has to be exposed by the CMP process in order to form the gate electrode using the conventional damascene process. Considering the height of the field oxide layer, the deposited thickness of the polysilicon layer 3 needs to be higher by at least an additional height a to make up for the step difference. Therefore, the hard mask layer for patterning the polysilicon layer has to be thicker by about 100 Å.

Consequently, the total height of the dummy gate 5 becomes taller by 300 to 600 Å, whereby the steps of etching the dummy gate polysilicon layer, removing the dummy gate selectively, and filling the gate metal layer into the space where the dummy gate is removed become difficult to carry out.

SUMMARY OF THE INVENTION

Accordingly, the present invention is directed to a method of forming a gate in a semiconductor device that substantially obviates one or more of the problems due to limitations and disadvantages of the related art.

The object of the present invention is to provide a method of forming a gate in a semiconductor device using a damascene process providing for a reduction the difficulty in a succeeding process by reducing the thickness of a dummy gate polysilicon layer using high etch selectivity in CMP.

Additional features and advantages of the invention will be set forth in the detailed description which follows, and in part will be apparent from that description, or may be learned by practice of the invention. The objectives and other advantages of the invention will be realized and attained by the structure particularly pointed out in the written description and claims hereof, as well as from the appended drawings.

To achieve these and other advantages, and in accordance with the purpose of the present invention as embodied and broadly described, a method of forming a gate in a semiconductor device according to the present invention includes the steps of forming a dummy gate insulating layer on a semiconductor substrate having a field oxide layer isolating the device, depositing a dummy gate polysilicon layer and a hard mask layer on the dummy gate insulating layer sequentially, patterning the hard mask layer into a mask pattern and patterning the dummy gate polysilicon layer using the mask pattern as an etch barrier, forming spacers at both sidewalls of the dummy gate polysilicon layer, depositing an insulating interlayer on the resultant structure after forming the spacers, exposing a surface of the dummy gate polysilicon layer by carrying out an oxide layer CMP process having a high selection ratio against the dummy gate polysilicon layer, forming a damascene structure by removing the dummy gate polysilicon layer and the dummy gate insulating layer using the insulating interlayer as another etch barrier, depositing a gate insulating layer and a gate metal layer on the entire surface of the semiconductor substrate having the damascene structure, and exposing a surface of the insulating interlayer by carrying out a metal CMP process having a high selection ratio against the insulating interlayer.

Preferably, the dummy gate polysilicon layer is formed to a thickness between 1300 to 2000 Å and the insulating interlayer is formed to a thickness between 4000 to 5000 Å.

Preferably, the polishing selection ratio between the insulating interlayer and the dummy gate polysilicon layer is maintained over 20 and the insulating interlayer CMP uses a slurry including $CeO_2$ particles. More particularly, the pH of the slurry, including the $CeO_2$ particles, is between 3 and 11.

Preferably, the polishing selection ratio between the insulating interlayer and the gate metal layer is maintained over 50 and the metal CMP uses a slurry for a metal layer. More preferably, the pH of the slurry for a metal layer is set between 2 and 7.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Figure 1A:
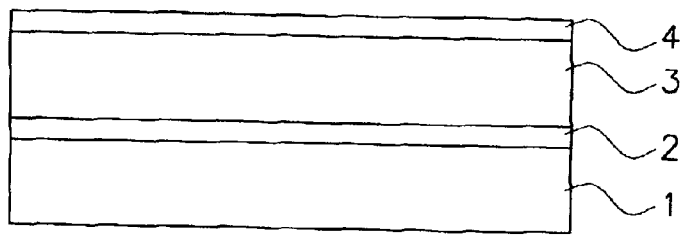
FIGS. 1A to 1F illustrate cross-sectional views of fabricating a gate on a semiconductor using the steps of a conventional damascene process.
Figure 1B:
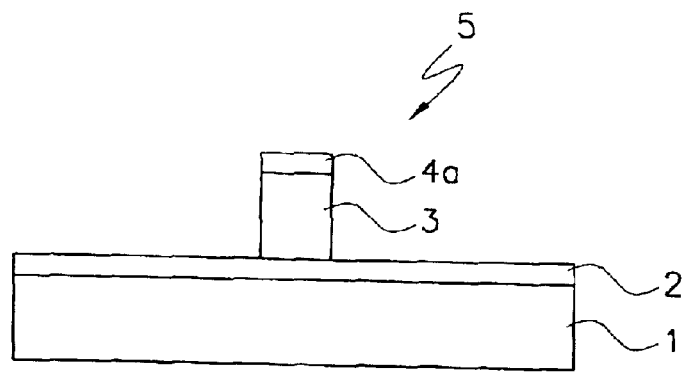
Figure 1C:
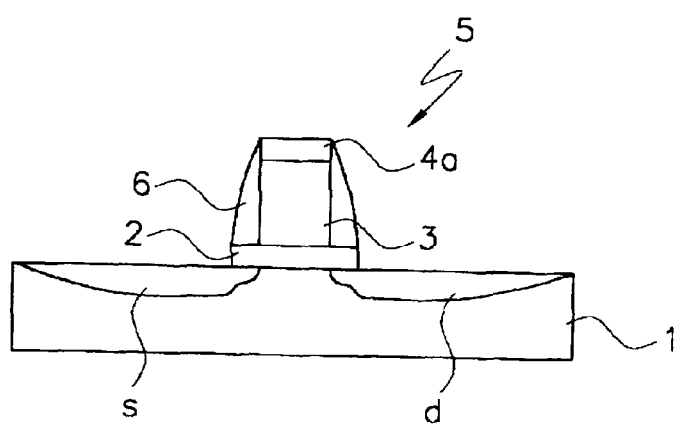
Figure 1D:
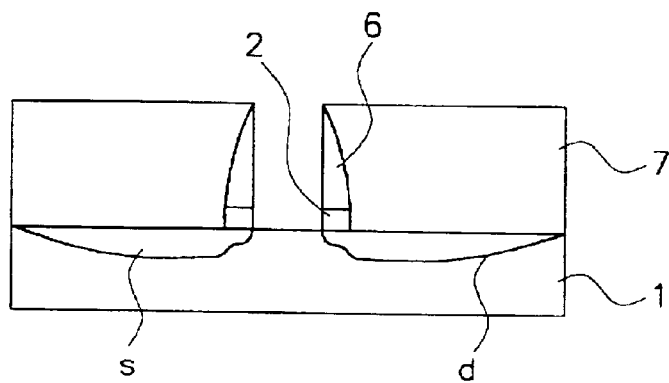
Figure 1E:
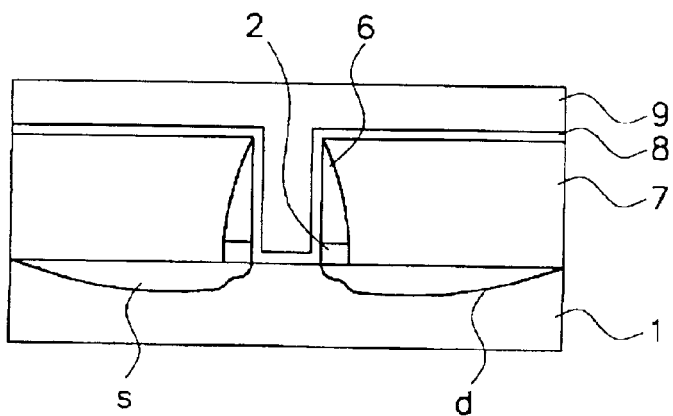
Figure 1F:
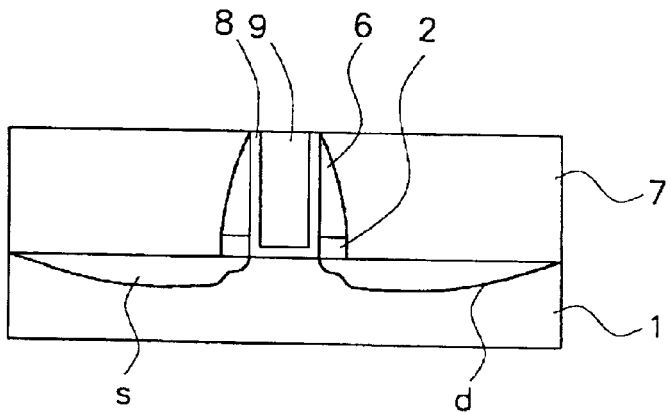
Figure 2:
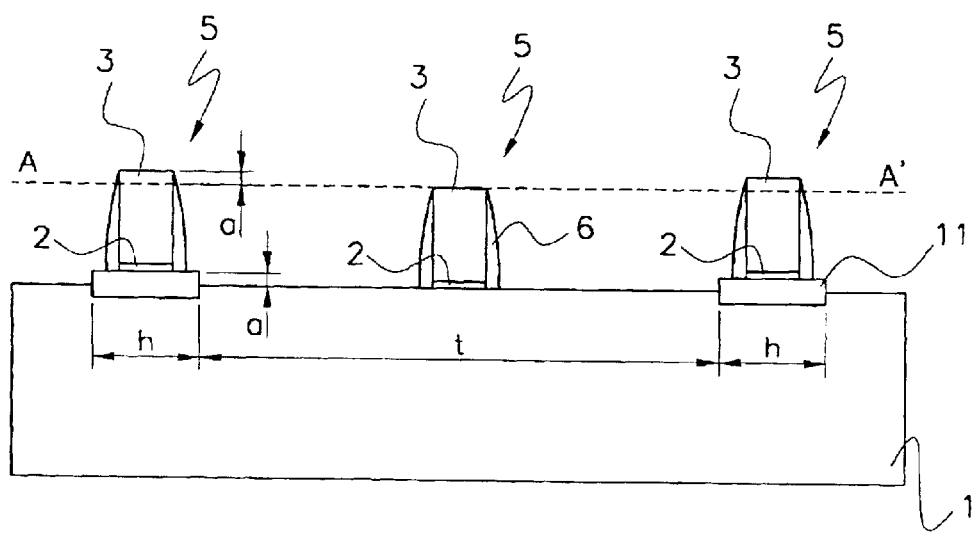
FIG. 2 illustrates a cross-sectional view for explaining problems generated from a method of forming a gate in a semiconductor device using a conventional damascene process.

Reference will now be made in detail to the preferred embodiments of the present invention, examples of which are illustrated in the accompanying drawings. Where possible, the same reference numerals will be used to illustrate like elements throughout the specification.

FIGS. 3A to 3F illustrate cross-sectional views of the steps of forming a gate using a damascene process according to an embodiment of the present invention.

Figure 3A:
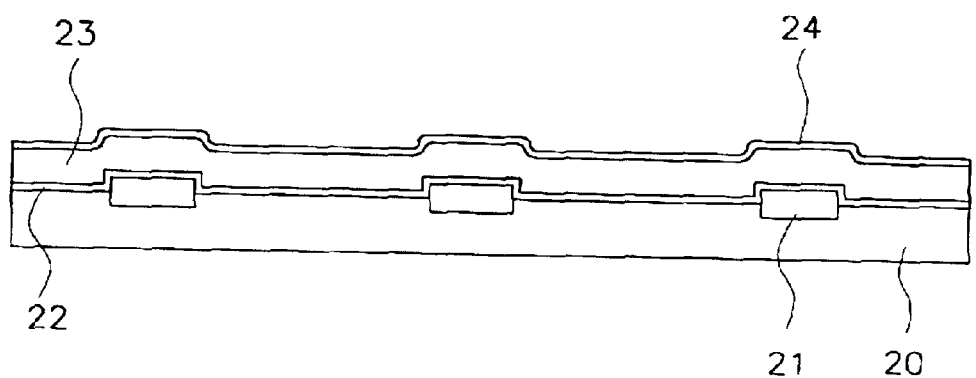
FIGS. 3A to 3F illustrate cross-sectional views of the steps of forming a gate using a damascene process according to an embodiment of the present invention.

Referring to FIG. 3A, a field oxide layer 21, isolating a device, is formed on a surface of a semiconductor substrate 20 and a dummy gate silicon oxide layer 22 is thereafter deposited on the semiconductor substrate 20. A dummy gate silicon layer 23 and a hard mask layer 24 are then successively formed on the dummy gate silicon oxide layer 22. In this case, the dummy gate silicon layer 23 is preferably formed of a doped polysilicon layer, which facilitates the establishment of the wet etch condition to remove the polysilicon layer.

Figure 3B:
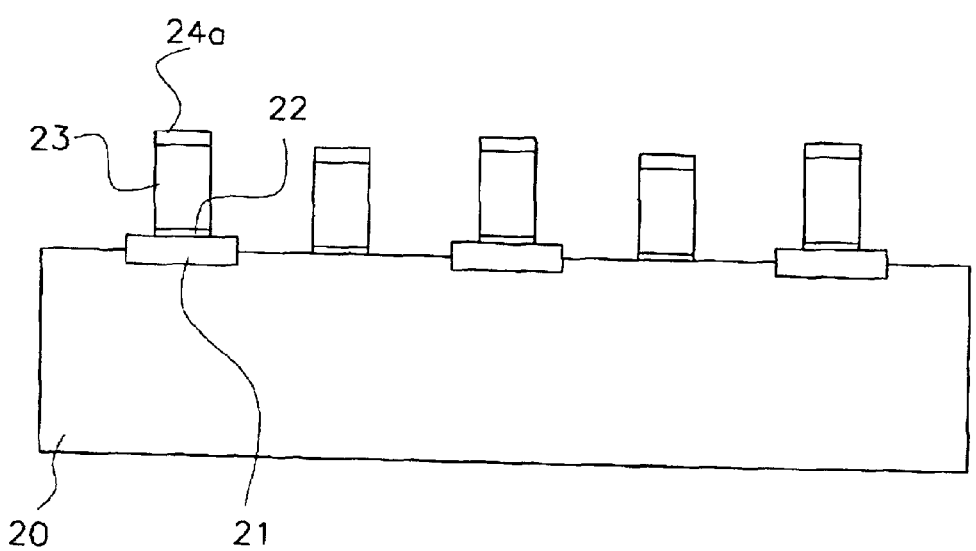

Referring to FIG. 3B, a mask pattern 24a is formed by patterning the hard mask layer 24. The dummy gate silicon layer 23 is then patterned using the mask pattern 24a as an etch barrier, thereby forming a dummy gate.

Figure 3C:
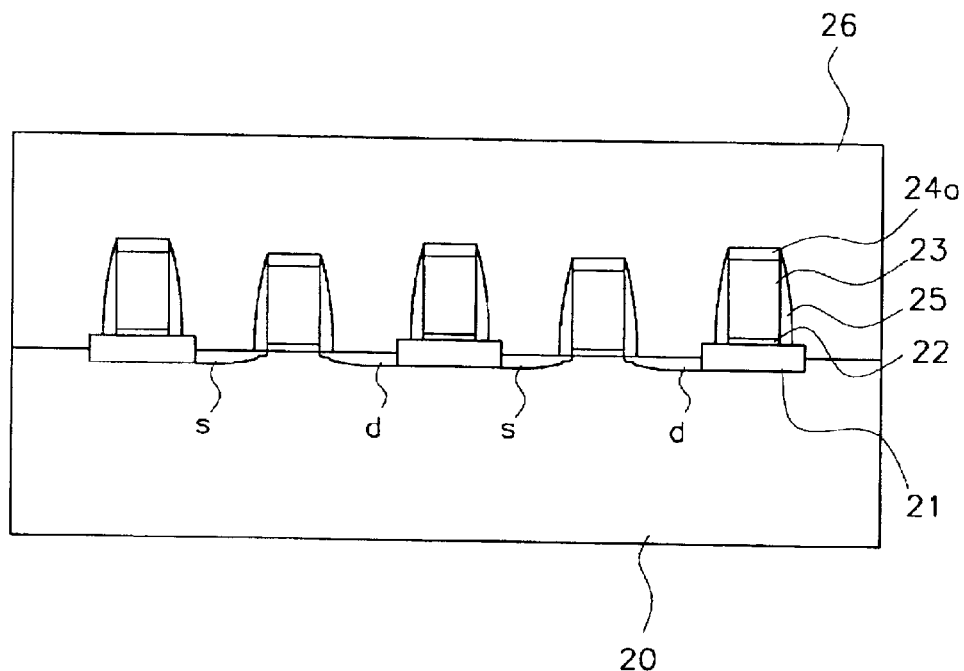

Referring to FIG. 3C, through a general process of forming source/drain regions, LDD (lightly doped drain) type source region s and drain region d are formed by light ion implantation of the semiconductor substrate 20, depositing a silicon nitride layer on the semiconductor substrate 20, carrying out a blanket-etch of the silicon nitride layer to form spacers 25, and then carrying out another heavy ion implantation. An insulating interlayer 26 is then deposited on the semiconductor substrate 20 and over the resultant structures.

Figure 3D:
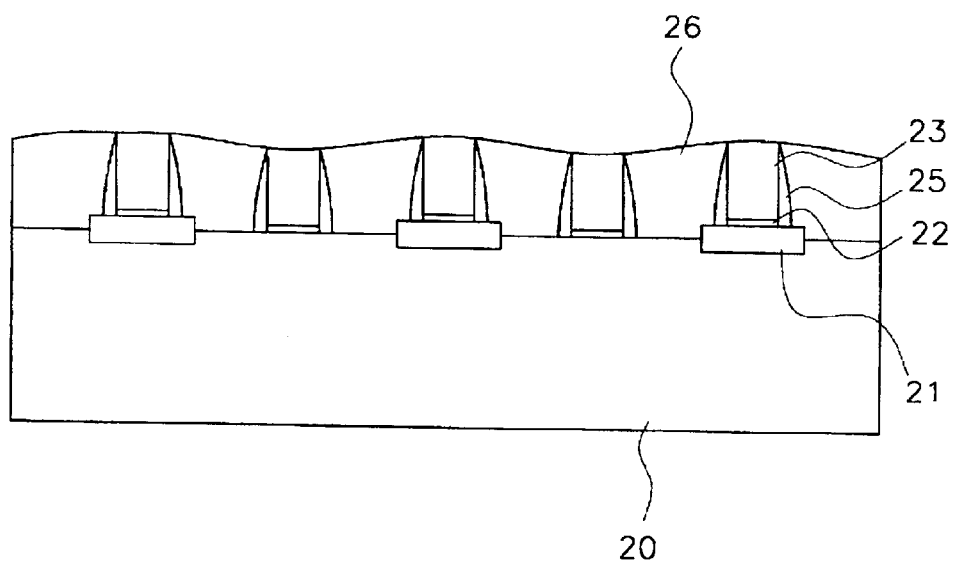

Referring to FIG. 3D, a surface of the dummy gate silicon layer 23 is exposed by polishing using a CMP process on the insulating interlayer 26 and on the hard mask pattern 24a. In this case, CMP is carried out with the following process conditions so as not to polish the dummy gate silicon layer 23.

In order to give a polishing selection ratio to the dummy gate silicon layer 23 and to the insulating interlayer 26, a slurry is chosen so that the dummy gate silicon layer 23 is not polished on carrying out CMP on the insulating interlayer 26. Generally, slurry containing $CeO_2$ particles has such a characteristic, since the $CeO_2$ slurry is over 10 in a polishing selection ratio of the insulating interlayer 26 to the dummy gate silicon silicon layer 23.

In contradistinction, a polishing selection ratio of conventional silica slurry is below 1, whereby it is impossible to prevent polishing of a polysilicon layer. Moreover, a polishing process using $CeO_2$, in which the pressure is reduced and the RPM of the support table is increased, when a holding CMP process is carried out on a polysilicon layer, is advantageous for increasing the polishing selection ratio over 20. In this case, the pH of the $CeO_2$ slurry preferably is set between 3 and 11.

Referring to FIG. 3D, after polishing, the surface of the dummy gate and the insulating interlayer 26 is wave-like in accordance with the step difference of the dummy gate polysilicon layer 23, and results from the CMP of the insulating layer 26.

Figure 3E:
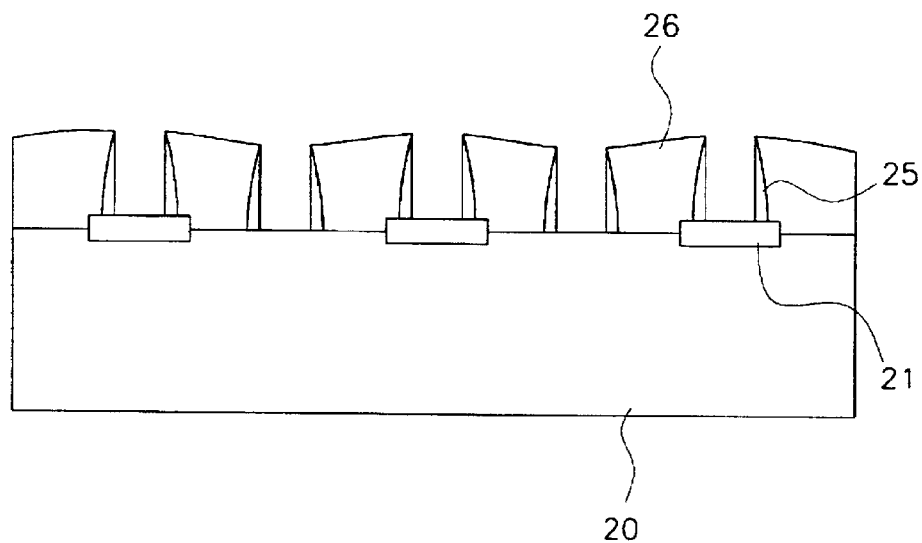

Referring to FIG. 3E, a damascene structure is formed by removing the exposed dummy gate silicon layer 23 and the underlying dummy gate silicon oxide layer 22. In this case, the dummy gate silicon and silicon oxide layers are removed by a wet etch or a dry etch.

Figure 3F:
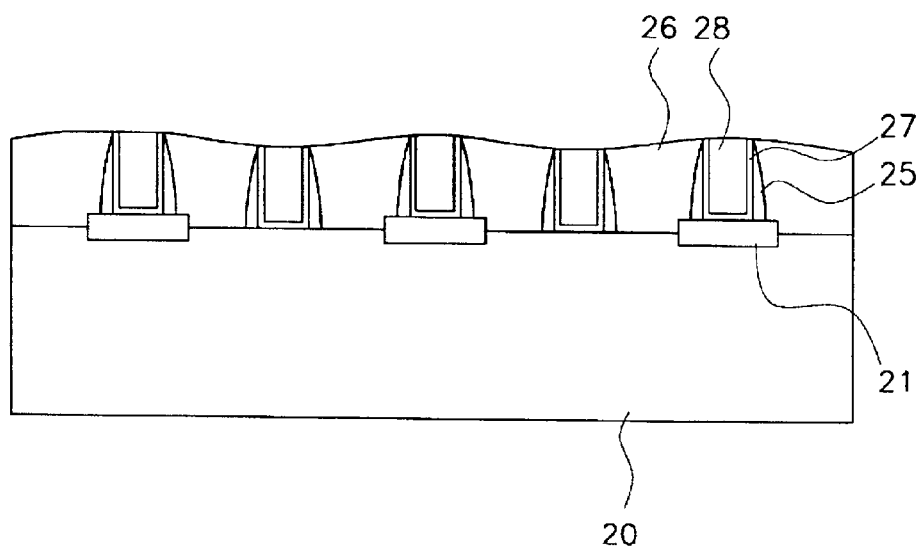

Referring to FIG. 3F, a gate insulating layer 27 and a gate metal layer 28 are deposited on a surface of the semiconductor substrate 20 from which the dummy gate silicon and silicon oxide layers have been removed. The surface of the insulating interlayer 26 is exposed by polishing the gate metal layer 28 and the gate insulating layer 27 by CMP. In this case, CMP is carried out with the following process conditions so as not to polish the insulating interlayer 26.

A CMP process for removing a gate metal layer is carried out by a mechanism proposed by Kaufmann et al., "Chemical Mechanical Polishing for Fabricating Patterned W Metal Features as Chip Interconnects", *Electrochemical Society*, Vol. 138, p. 3460, 1991, in a manner that the gate metal layer is oxidized into metal oxide using an oxidizer included in slurry and that particles included in the slurry such as silica or alumina remove the metal oxide mechanically. In this case, acidic slurry, preferably the pH of which is set between 2 and 7, accelerates such a reaction, but does not polish the insulating interlayer after the gate metal layer has been removed. Thus, a metal gate of a semiconductor device is completed.

As mentioned in the above description, a surface, which is polished by CMP using the CMP slurry having a high selection ratio between a dummy gate insulating layer and a polysilicon layer or between a gate metal layer and an insulating interlayer, produces a wave-like profile. This reduces the height of the dummy gate polysilicon layer, thereby facilitating the process of etching the dummy gate polysilicon layer in FIG. 3B. Moreover, since the height of the dummy gate layer is short, an insulating layer is deposited between the gates without voids.

Further, the process of removing the dummy gate polysilicon and insulating layers in a damascene structure is facilitated by the short dummy gate polysilicon layer, thereby enabling a stable gap-filling process for the gate metal layer.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of forming gates in a semiconductor device having a non-linear top profile, the method comprising the steps of:

forming a dummy gate insulating layer on a semiconductor substrate having a field oxide layer isolating the device;

depositing a dummy gate polysilicon layer on the dummy gate insulating layer;

depositing a hard mask layer on the dummy polysilicon layer;

patterning the hard mask layer into a mask pattern;

forming a plurality of dummy gates by patterning the dummy gate polysilicon layer and the dummy gate insulating layer using the mask pattern as an etch barrier, wherein a plurality of the mask patterns is formed on the dummy gates, wherein a number of the plurality of the dummy gates are formed on the semiconductor substrate while another number of the plurality of dummy gates are formed on the field oxide layer, wherein the mask patterns on the dummy gates formed on the field oxide layer is at a higher distance when measured from the surface of the semiconductor substrate than the mask patterns on the dummy gates formed on the semiconductor substrate;

forming a spacer at each of the two sidewalls of each of the dummy gate;

depositing an insulating interlayer on the resultant structure after forming the spacers;

performing a non-linear planarization by performing chemical mechanical polishing (CMP) process to polish away the insulating interlayer formed above the mask patterns and the mask patterns, exposing the patterned dummy gate polysilicon layer of each dummy gate, wherein a first high selection ratio between the insulating interlayer and the dummy gate polysilicon layer is over 20;

wherein the length of each dummy gate formed on the semiconductor substrate and the length of each dummy gate formed on the field oxide are identical, and wherein the surface of the polished dummy gate and the insulating layer is wave-like due to the height difference between the dummy gates formed on the field oxides and those formed on the semiconductor substrate;

forming a damascene structure by removing the patterned dummy gate polysilicon and insulating layers using the insulating interlayer as another etch barrier; and depositing a gate insulating layer and a gate metal layer on the entire surface of the semiconductor substrate having the damascene structure.

2. The method of claim 1, wherein the dummy gate polysilicon layer is formed to a thickness of from 1300 to 2000 Å.

3. The method of claim 1, wherein the insulating interlayer is formed to a thickness of from 4000 to 5000 Å.

4. The method of claim 1, wherein the insulating interlayer chemical mechanical polishing uses a slurry including $CeO_2$ particles.

5. The method of claim 4, wherein the pH of the slurry, including CeOparticles, is set between 3 and 11.

6. The method of claim 1, wherein a metal chemical mechanical polishing uses slurry for the metal layer.

7. The method of claim 6, wherein the pH of the slurry for a metal layer is set between 2 and 7.

* * * * *